United States Patent [19]

De Givry

[11] Patent Number: 5,229,960

[45] Date of Patent: Jul. 20, 1993

[54] SOLID STATE MEMORY MODULES AND MEMORY DEVICES INCLUDING SUCH MODULES

[75] Inventor: Jacques De Givry, Les Loges En Josas, France

[73] Assignee: Matra Marconi Space France, Paris, France

[21] Appl. No.: 800,521

[22] Filed: Dec. 4, 1991

[51] Int. Cl.⁵ .................................................. G11C 5/06
[52] U.S. Cl. .......................................... 365/63; 365/52
[58] Field of Search .................... 365/63, 52; 439/69, 439/44

[56] References Cited

U.S. PATENT DOCUMENTS

| | | | |
|---|---|---|---|
| 4,045,105 | 8/1977 | Lee | 439/69 |
| 4,080,026 | 3/1978 | Gianni | 439/69 |
| 4,192,565 | 3/1980 | Gianni | 439/69 |
| 4,558,397 | 12/1985 | Olsson | 439/69 |
| 4,696,525 | 9/1987 | Coller | 439/69 |
| 4,884,237 | 11/1989 | Muller | 369/63 |

FOREIGN PATENT DOCUMENTS 0855731 8/1981 U.S.S.R. ............................. 369/63

Primary Examiner—Eugene R. LaRoche
Assistant Examiner—A. Zarabian
Attorney, Agent, or Firm—Larson and Taylor

[57] ABSTRACT

A memory module has, on an interconnection substrate, a plurality of semi-conductor memory chips each having the same elongated shape and having output connections located at the end thereof. It has at least two chips which are mutually stacked and which are crossed so that the outputs of one chip are available beyond the periphery of the chip which is located under it in the stack. Consequently, the outputs of each chip may easily be connected to the substrate by bonded flexible wires.

10 Claims, 4 Drawing Sheets

5,229,960

SOLID STATE MEMORY MODULES AND MEMORY DEVICES INCLUDING SUCH MODULES

BACKGROUND OF THE INVENTION

The invention relates to the field of memory devices used in computer systems, and in particular to large capacity memories.

The memory capacity requirements of computer systems are growing continuously. In many cases, the available space must be as small as possible. These requirements have led to unitary components of ever greater integration being developed: in 1990, the capacities of read/write randomly accessible memory (RAM) components had reached 1 Mbit for static RAM and 4 Mbits for DRAMS. They have also led to interconnection methods enabling chips to be mounted at high densities. To further increase the capacity in a given volume, memory modules have been proposed comprising a stack made up of a plurality of superposed chips on an interconnection substrate. Chips are thus distributed in three dimensions instead of being distributed in a plane only. Unfortunately, problems have been encountered with chip interconnection and above all with connections between the chips and the substrate that give rise to iterative processes that are expensive and lengthy. Because the chips are superposed exactly, it is necessary to make connections to the lower most chip, then to install a spacer, bond the next chip up, wire this new chip, and so on.

Proposals have also been made (Patent Abstracts of Japan, Vol. 11, No. 148, E 506, May 14, 1987) and JP-A-61 287 133 to make a stack comprising a plurality of chips, namely a mass memory, a processor, and a program memory. These chips are of decreasing size going from the substrate to the last chip which is the program memory. The program memory which is smaller than the others is placed transversely to the other two chips which are elongated in the same direction. Because of the different dimensions of the three chips, they can be interconnected. That is not the object of the present invention which seeks to facilitate interconnecting the substrate and the various same-sized memories of a memory module.

SUMMARY OF THE INVENTION

The present invention seeks to increase the installation densities commonly in use at present by distributing chips in three dimensions rather than in a plane, while nevertheless avoiding the interconnection problems that have hampered previously-proposed solutions. To this end, the invention makes use of the observation that most existing large capacity memory chips are in the form of a highly elongated rectangle and that the outlet connections of such chips are often concentrated at the two ends thereof. For example, the 1 Mbit memory chip HC 628-128 has a length L and a width 1 that are respectively 14.4 mm and 5.7 mm, and it has sixteen connection tabs at each end. With that object in mind, there is provided a memory module comprising, on an interconnection substrate, a plurality of semi-conductor memory chips each having the same elongated and each having output connections located at the ends thereof. The module comprises at least two chips which are mutually stacked and which are crossed so that the output connections of one chip are beyond the chip located immediately under it in the stack.

Two successive chips are always mutually crossed. This is not the same disposition as that described in the above identified japanese document, where the bottom two chips are oriented in the same manner.

Because of the way the chips are crossed over, connections can be made to both ends of each chip without difficulty since a lower chip does not impede making connections to a higher chip. At first glance the crossed configuration for two chips does not save any space. However, it is always necessary to associate smaller-sized auxiliary components with memories, such as capacitors and/or integrated logic circuits. These small-sized components can be placed between the branches of the cross.

When the chips are sufficiently elongated, three chips can be crossed at 60° relative to one another.

Whether two crossed chips or three crossed chips are used, it is desirable to place supports under the ends of the chips in order to ensure that the soldering machine for connecting aluminum or gold wires to the end tabs of the chips do not press down on an overhanging portion of chips.

Other sets of two chips can be superposed on a stack of two crossed chips, with supports being interposed each time to avoid overhangs.

An advantageous embodiment of the invention is applicable when each chip is more than twice as long as it is wide. Then a set of two mutually parallel identical chips may be stacked and crossed at right angle with another set of two mutually parallel chips which are identical to the chips of the first set. This disposition makes it possible to increase compactness considerably.

The invention will be better understood on reading the following description of particular embodiments of the invention given by way of non-limiting examples. The description refers to the accompanying drawings.

DETAILED DESCRIPTION OF PREFERRED EMBODIMENTS

Figure 1:
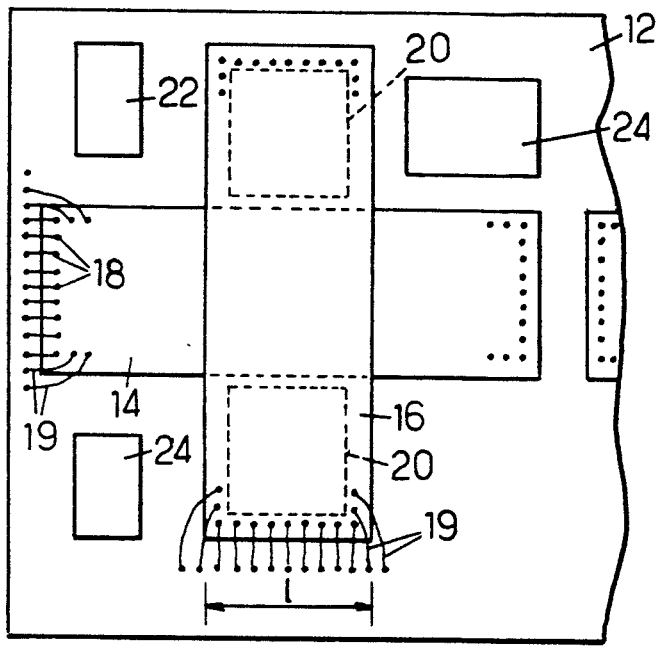
FIG. 1 is a schematic elevation diagram showing a micro-module made up of two memory chips on a substrate.

The micro-module shown diagrammatically in FIG. 1 comprises a supporting substrate 12 and two memory chips 14 and 16 that are elongated in shape. The chip 14 is stucked directly bonded on substrate 12 which may be a ceramic substrate carrying a hybrid circuit, for example. The output tabs 18 of the chip 14 are connected to tracks formed on the supporting substrate 12 by flexible wires 19 (generally made of aluminum or of gold) and fixed by thermocompression or by thermosonic bonding. The chip 16 is crossed with and glued to the chip 14 and its output tabs are likewise connected to tracks on the supporting substrate 12 by wires 19 which are longer than the wires used for connection to the tabs 18. The chips can be glued using an insulating epoxy or silicone resin without danger of corrosion, the surfaces of the chips being passivated in the region in contact with the adhesive. To prevent unwanted overhang when engaging the bonding probe, blocks 20 having the same thickness as the chip 14, i.e. supports that are very thin (generally less than 0.3 mm) are interposed beneath the end portions of the chip 16. In general, blocks made of silicon may be used, which blocks may be fragments of rejected chips.

Automatic machinery is presently available that is capable of installing the chip 14 and blocks 20, then chip 16.

The wasted zones that remain between the branches of the cross formed by the chips 14 and 16 may receive components that are small in size, such as a capacitor 22 and associated logic circuits 24 such as buffer registers, coupling circuits etc. . . .

Figure 2:
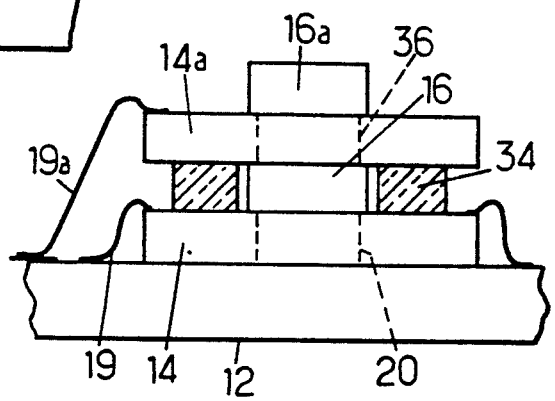
FIG. 2 is an elevation view showing how two pairs of chips are juxtaposed, the two chips in each pair having the disposition shown in FIG. 1.

As shown in FIG. 2, two sets of chips of the kind shown in FIG. 1 can be stacked up thereby saving additional space. The chip 14a placed above the chip 14 is separated therefrom by the chip 16 and by supports 34 which must then leave a small amount of overhang so as to avoid interfering with the bonds to the wires 19 and to avoid crushing the wires. There is also true as regards supports 36 interposed between the chips 16a and 16.

The number of pairs of chips that can be stacked in this way is limited in particular by the conventional techniques of automatic assembly: thermosonic bonding machines can accept only a limited amount of offset between the bonds formed at the two ends of a same wire. FIG. 2 shows that the offset between the end bonds of a wire 19a is already significantly greater than the offset between the bonds at the ends of a wire 19.

Another limitation on the number of pairs is due to the iterative nature of the assembly process: whereas in FIG. 1 a single bonding sequence suffices, two sequences are necessary for the case shown in FIG. 2, since the first pair must be installed and the wires bonded thereto, then the chips of the second stage need be glued thereon and finally another wire-bonding operation is performed.

Figure 3:
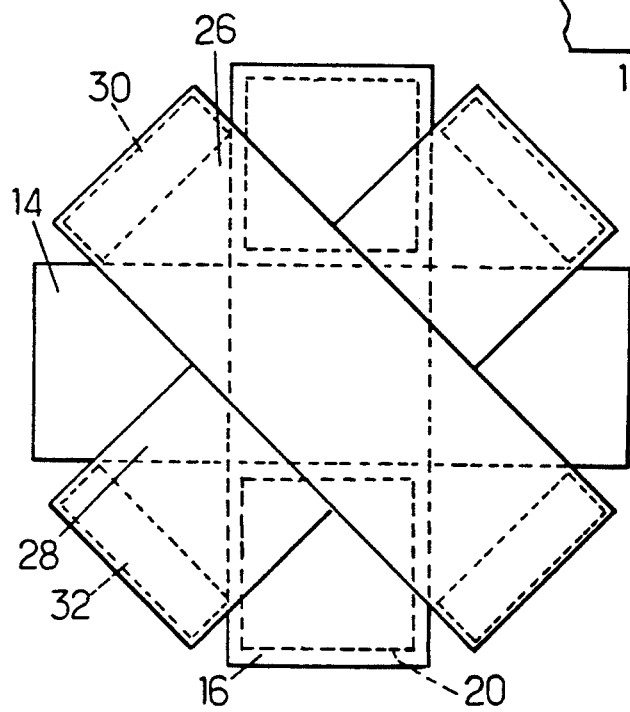
FIG. 3 is a diagram of a module comprising three chips crossed at 60°.

When the length (L) to width (l) ratio of the memory chips is large enough, it becomes possible to cross more than two chips so as to authorize wiring of a larger number of chips disposed in a star configuration in a single operation. In particular, three chips can be used at 60° intervals to one another. It is also possible to place four chips 14, 16, 26 and 28 in a star arrangement as shown in FIG. 3. In this case, supports 20, 30 and 32 of different thicknesses and sizes need be provided. The chips and supports are initially assembled by gluing, after which wiring is performed as in the case shown in FIG. 1.

Figure 4:
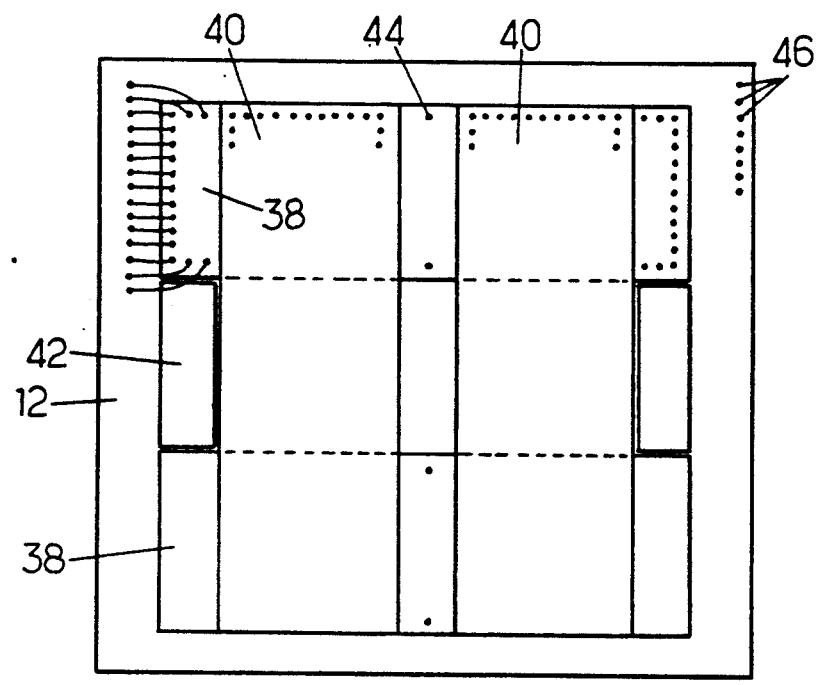
FIG. 4 is similar to FIG. 1 and shows a particularly advantageous embodiment of the invention.

FIG. 4 shows an embodiment of the invention that is particularly advantageous for the amount of space it saves and for its lack of overhang. The micro-module shown in FIG. 4 comprises a bottom pair of chips 38 and a top pair of chips 40. The two chips in each pair are disposed parallel to each other and are crossed relative to the two chips in the other pair. The chips 38 are glewed directly onto the substrate and they are spaced apart in such a manner that the end portions of the chips 40 placed thereon do not overhang. Blocks 42 may be placed between the chips 38 to guarantee that they are installed relatively accurately. The spacing between the chips 14 is such as to leave the terminal portions of the chips 38 uncovered, and in particular the connection tabs thereon for the wires 19. This assembly can also be used with chips having output tabs 44 a middle region thereof.

In the device shown in FIG. 4, integration density is practically doubled compared with normal mounting.

It is possible to make up an independent micro-module that can be individually tested and is interchangeable with another micro-module by using a small size substrate 12 with all interface connections of the micro-module being brought out along a single edge on the module on output tabs 46, by means of printed circuit tracks.

Figure 5:
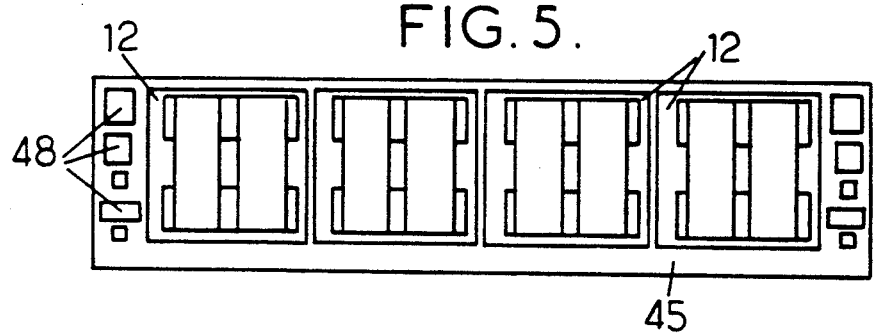
FIG. 5 shows a memory device including four micro-modules of the kind shown in FIG. 4.

A plurality of micro-modules of the kind shown in FIG. 4 can be mounted on one or both faces of a support of larger size, of the co-baked type, or carrying thick film circuits. FIG. 5 shows four micro-modules each having a substrate 12 fixed on a support 45 carrying interconnection circuits in thick film technology, for example. The supports 45 may also carry auxiliary components 48.

Figure 5A:
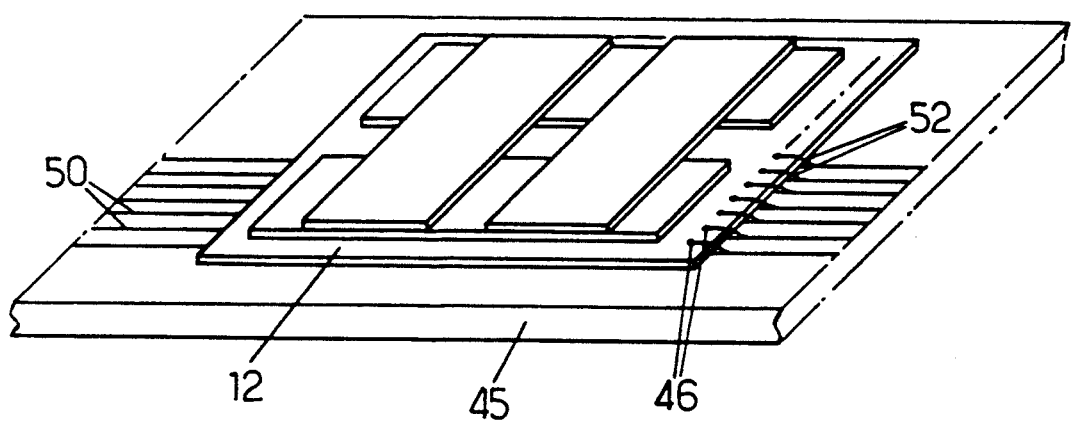
FIG. 5A is a perspective diagram showing how the tabs of the chips in a micro-module of the kind shown in FIG. 5 may be connected to a bus that is provided on a support.

In a module of the kind shown in FIG. 5, the connections can be made particularly simple by providing a bus on the support 45 passing beneath the substrates 12. The substrate connection tabs are then connected to the wires of the bus via plated through-holes in the substrates. Connections may alternatively be made to the conductors of the bus 50 using bonded lengths of wire 52, as shown diagrammatically in FIG. 5a.

Figure 6:
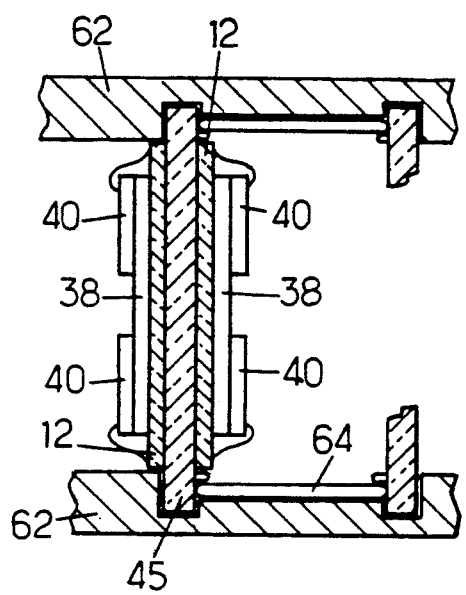
FIG. 6 shows a device that includes a support having two faces.
Figure 7:
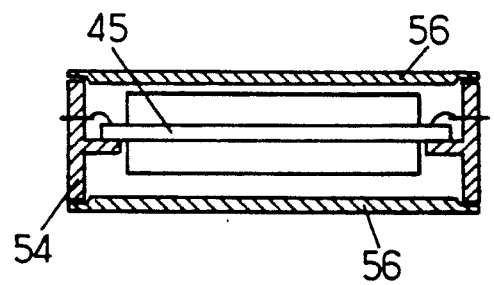
FIG. 7 is similar to FIG. 6 and shows one possible way of mounting in a sealed package.

A support 45 may be provided with micro-modules on both faces, as shown in FIG. 6. It is thus possible to make up modules having four micro-modules on each face thus corresponding to a memory organized in bytes. Such a module can be placed in a metal package having a frame 54 and sealed covers 56, as shown in FIG. 7. The support may be one of the two-faced substrates called "multi-chip modules" currently being commercialized, where both faces are connectable via links inside of the support.

Figure 8:
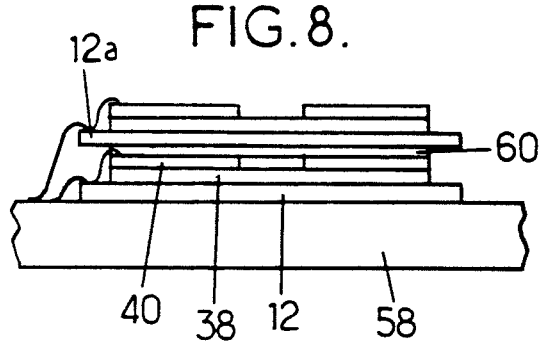
FIGS. 8 and 9 are similar to FIG. 6 and show modified embodiments.

In another possible disposition, shown in FIG. 8, two micro-modules each having the configuration shown in FIG. 5 are superposed on a support 58. The two micro-modules are then identical, but a spacing block 60 must be provided between them to avoid flattening the connection wires of the lower micro-module. Another solution shown diagrammatically in FIG. 9 consists in using an upper micro-module whose supporting substrate 12a has a larger area than the supporting substrate 12 of the lower micro-module, thereby enabling the upper module to rest on a frame shaped block 60. The frame 60 has then a thickness that leaves a clearance to pass wires from the lower micro-module to the substrate 12a.

Figure 9:
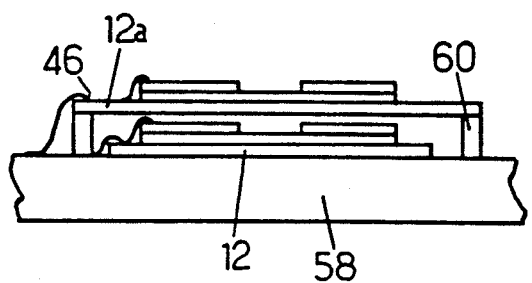

In the case shown in FIG. 9, a carrying substrate could be at an angle of 180° from the other and be designed so that each row of external connection tabs 46 corresponds to the locations of a rectilinear bus on the support 58.

A plurality of modules of the kind shown in FIG. 6 can be juxtaposed in parallel inside a metal housing or frame carrying a mother card for constituting a memory device. FIG. 6 shows that the walls 62 of such a frame are formed with slots in which the supports 45 are engaged. The heat generated by the circuits is dissipated by the edges of the supports 45 pressed against the walls of the slots by springs 64. The mother card (not shown) is provided at the bottom of the frame.

Figure 10:
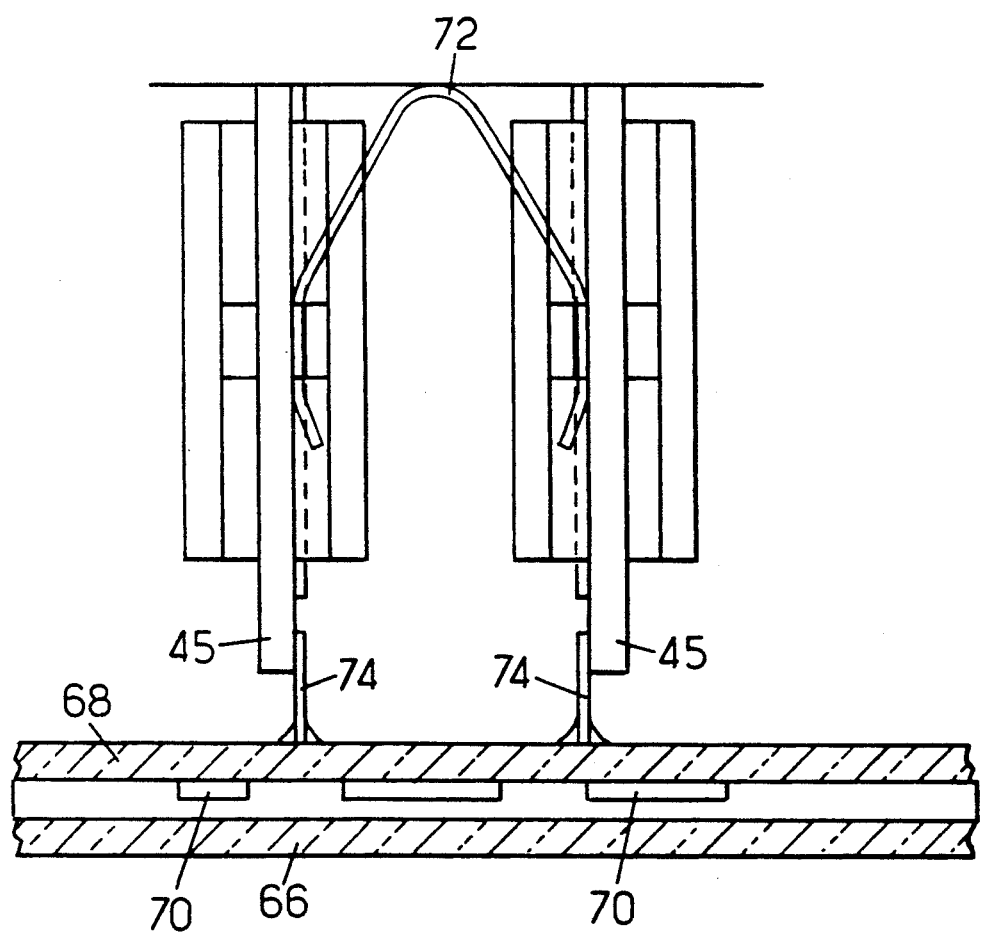
FIG. 10 is a schematic diagram showing one possible way of mounting micro-modules for connection with a mother card.

FIG. 10 shows a device which constitutes a modification of that shown in FIG. 6. The bottom 66 of the frame carries a mother card 68 which may optionally carry, on its rear face, components such as memories or sets of buffer flip-flops, capacitors, etc. . . . 70. The supports 45 each carrying a set of four chips on each face there are again guided by slots (not shown). Hairpin springs 72 received in housings in the frame urge the edges of the supports against the walls of the slots, thereby guaranteeing good thermal contact. The supports 45 are provided with rows of output pins 74 of equal lengths fixed to the supports e.g. by high temperature bonding or by electrical welding under pressure. The output pins 74 are in contact with the mother card 68 which is generally constituted by a thick layer circuit or by a ceramic cobaked circuit of the type commonly referred to as a "multi-chip module". The card is previously locally tinned at the locations receiving the output pins 74. The output pine 74 can then be secured in the tinned areas by a single re-melting operation, e.g. in vapor phase.

The assembly constituted in this way can be hermetically enclosed in a package fitted with parallel outputs that extend the mother card.

The construction shown in FIG. 10 makes it possible to place micro-modules at a spacing of 3 mm, thereby enabling 16 micro-modules to containing 4-Mbit chips to be installed, thus constituting a memory module having a capacity of 0.5 Gbits in a volume that does not exceed 35 mm × 65 mm × 34 mm.

I claim:

1. A memory module comprising an interconnection substrate and a plurality of semi-conductor memory chips carried by said substrate, all said chips having a same elongated shape with two end portions and two lateral sides directed along the direction of elongation and each of said chips having output connections located at said end portions,
   wherein at least two of said chips are mutually stacked and are mutually crossed so that the output connections of an upper one of said two chips are beyond said lateral surfaces of the chip which is located under said upper one of said two chips in the stack,
   wherein the output connections of each of said two chips are located on a major surface of the respective chip which is farther from the interconnection substrate, and
   wherein said output connections are electrically connected to conductive paths on said interconnection substrate by bonded flexible wires.

2. A memory module comprising an interconnection substrate and a plurality of semi-conductor memory chips carried by said substrate,
   wherein all said chips having a same elongated shape,
   wherein each of said chips has output connections located at end portions thereof,
   wherein at least two of said chips are mutually stacked and are mutually crossed so that the output connections of an upper one of said two chips are beyond a periphery of the chip which is located under said upper one of said two chips in the stack,
   wherein the output connections of each of said two chips are located on a major surface of the chip which is farther from the interconnection substrate, and are electrically connected to conductive paths on said interconnection substrate by bonded flexible wires,
   wherein a lowest one of said chips in said stack is bonded to the interconnection substrate, and
   wherein supporting blocks are located under cantilevered ends of each of said chips other than said lowest chip.

3. Module according to claim 1, comprising three said chips at mutual angles of 60°.

4. Module according to claim 1, further comprising small size auxiliary components placed between end portions of said two mutually crossed chips.

5. Module according to claim 4, wherein said auxiliary components are capacitors and integrated logic circuits.

6. Memory module comprising:
   an interconnection substrate;
   a first set of two mutually parallel identical semi-conductor memory chips bonded to said substrate, having an elongated shape and having output connections located at the ends thereof and on their surface away from said interconnection substrate; and
   a second set of two mutually parallel semi-conductor memory chips which are identical to the chips of the first set and are crossed at right angle with the chips of said first set, having their output connections located on their surface away from said interconnection substrate,
   said output connections of all said chips being electrically connected to said interconnection substrate by bonded wires.

7. Module according to claim 6, wherein said first set and said second set constitute a first unit and said module further comprises an additional unit consisting of two additional sets identical to the sets of the first unit, superposed to the first unit and supporting blocks located under cantilevered ends of chips of said additional unit.

8. Module according to claim 6, wherein said substrate has two major faces and each said major face carries at least one said first set and one said second set.

9. Module according to claim 7 wherein said substrate has two major surfaces and each said major face carries at least one said first unit and one said additional unit.

10. Module according to claim 1, further comprising an insulating support having a major surface carrying conductive paths constituting a bus, wherein a plurality of said interconnection substrates each having at least two said chips are bonded on said insulating support, said bus passing under a plurality of said substrates which are each provided with means for electrical connection with the bus.

* * * * *

UNITED STATES PATENT AND TRADEMARK OFFICE
CERTIFICATE OF CORRECTION

PATENT NO. : 5,229,960

DATED : July 20, 1993

INVENTOR(S) : DE GIVRY

It is certified that error appears in the above-identified patent and that said Letters Patent is hereby corrected as shown below:

Title page, add item [30]

FOREIGN APPLICATION PRIORITY DATA

December 5, 1990 [FR]    France ...... 90 15210

Signed and Sealed this

Twelfth Day of April, 1994

Attest:

BRUCE LEHMAN

Attesting Officer

Commissioner of Patents and Trademarks